(12) United States Patent
Oh et al.

(10) Patent No.: US 11,424,299 B2
(45) Date of Patent: Aug. 23, 2022

(54) PRESSURE SENSITIVE DISPLAY DEVICE HAVING TOUCH ELECTRODE AND LIGHT EMITTING LAYER

(71) Applicant: ELECTRONICS AND TELECOMMUNICATIONS RESEARCH INSTITUTE, Daejeon (KR)

(72) Inventors: Ji-Young Oh, Daejeon (KR); Seung Youl Kang, Daejeon (KR); Seongdeok Ahn, Daejeon (KR); Jeong Ik Lee, Daejeon (KR); Chi-Sun Hwang, Daejeon (KR); Byoung-Hwa Kwon, Daejeon (KR); Tae-Youb Kim, Daejeon (KR); Jeho Na, Seoul (KR); Sooji Nam, Seoul (KR); Jaehyun Moon, Daejeon (KR); Young Sam Park, Daejeon (KR); Chan Woo Park, Daejeon (KR); Doo-Hee Cho, Daejeon (KR); Chul Woong Joo, Sejong-si (KR); Jae-Eun Pi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 283 days.

(21) Appl. No.: 16/842,396

(22) Filed: Apr. 7, 2020

(65) Prior Publication Data
US 2020/0321403 A1  Oct. 8, 2020

(30) Foreign Application Priority Data

Apr. 8, 2019 (KR) .......... 10-2019-0041094
Feb. 5, 2020 (KR) .......... 10-2020-0013841

(51) Int. Cl.
*H01L 27/32* (2006.01)
*H01L 51/50* (2006.01)
(Continued)

(52) U.S. Cl.
CPC .......... *H01L 27/323* (2013.01); *G06F 3/0412* (2013.01); *H01L 51/0097* (2013.01);
(Continued)

(58) Field of Classification Search
None
See application file for complete search history.

(56) References Cited

U.S. PATENT DOCUMENTS 10,292,234 B2  5/2019  Park et al.
11,132,085 B2 *  9/2021  Yang ............... G06F 3/0412
(Continued)

FOREIGN PATENT DOCUMENTS

KR  101077385 B1 * 10/2011  .......... G06F 3/0412
KR  101077385 B1  10/2011
(Continued)

*Primary Examiner* — Nduka E Ojeh
(74) *Attorney, Agent, or Firm* — Rabin & Berdo, P.C.

(57) ABSTRACT

Provided is a pressure sensitive display device including a sensing substrate, a reaction substrate provided on the sensing substrate, and spacers provided between the sensing substrate and the reaction substrate to space the sensing substrate apart from the reaction substrate. Here, the sensing substrate includes a flexible substrate and a touch electrode provided on one surface of the flexible substrate, which faces the reaction substrate. The reaction substrate includes a transparent substrate, a transparent electrode provided on one surface of the transparent substrate, which faces the sensing substrate, and a light emitting layer disposed on the transparent electrode.

22 Claims, 9 Drawing Sheets

(51) Int. Cl.
*H01L 51/00* (2006.01)
*G06F 3/041* (2006.01)

(52) U.S. Cl.
CPC ........ *H01L 51/502* (2013.01); *H01L 51/5092* (2013.01); *G06F 2203/04105* (2013.01)

(56) References Cited

U.S. PATENT DOCUMENTS

| | | |
|---|---|---|
| 2013/0194237 A1 | 8/2013 | Kyung et al. |
| 2014/0111480 A1 | 4/2014 | Kim et al. |
| 2015/0047957 A1* | 2/2015 | Tokuno ................... G06F 3/041 200/295 |
| 2015/0294099 A1 | 10/2015 | Frye et al. |
| 2018/0012069 A1 | 1/2018 | Chung et al. |
| 2019/0018271 A1* | 1/2019 | Xie ........................ G06F 3/0412 |
| 2019/0140137 A1* | 5/2019 | Kim ........................ H01L 33/32 |
| 2019/0235677 A1* | 8/2019 | Liu ......................... G06F 3/042 |
| 2019/0250764 A1* | 8/2019 | Kim ...................... G06F 3/0446 |
| 2019/0311172 A1 | 10/2019 | Kang et al. |
| 2020/0326576 A1* | 10/2020 | Kamitani .......... G02F 1/133512 |

FOREIGN PATENT DOCUMENTS

| | | |
|---|---|---|
| KR | 20160144454 A | 12/2016 |
| KR | 10-2017-0136667 A | 12/2017 |
| KR | 10-2018-0005588 A | 1/2018 |
| KR | 10-2018-0005833 A | 1/2018 |
| KR | 101961062 B1 | 3/2019 |

* cited by examiner

PRESSURE SENSITIVE DISPLAY DEVICE HAVING TOUCH ELECTRODE AND LIGHT EMITTING LAYER

CROSS-REFERENCE TO RELATED APPLICATIONS

This U.S. non-provisional patent application claims priority under 35 U.S.C. § 119 of Korean Patent Application Nos. 10-2019-0041094, filed on Apr. 8, 2019, and 10-2020-0013841, filed on Feb. 5, 2020, the entire contents of which are hereby incorporated by reference.

BACKGROUND

The present disclosure herein relates to a pressure sensitive display device, and more particularly, to a pressure sensitive display device sensing a pressure to generate light at a position corresponding thereto.

Various pressure sensors have been developed for the purpose of being applied to electronic skins and robotics through a wearable element technology or various electronic element technologies. Matrix-type pressure sensors have been developed so that the pressure sensors are integrated to measure a single pressure or multiple pressures applied within a predetermined area. An applied pressure may be measured by using a resistance variation-type, a capacitance variation-type, and other pressure sensitive element (TFT) in such a manner that scanning is performed in a pixel or line unit, a signal of the applied pressure is analyzed through the scanning, and then a position, size, and motion information of the pressure is displayed on a separate display for a user. Currently, a high cost pixilated pressure sensor is manufactured, scanning and analysis of an input signal is performed by using the pressure sensor, and then results are displayed so that the user recognizes a pressure signal. Thus, an element that simultaneously performing functions such as high performance, ultra-minuteness, and intuitive recognition is hardly realized.

SUMMARY

The present disclosure provides a pressure sensitive display device having a simple structure and a manufacturing method thereof.

The present disclosure also provides a pressure sensitive display device having an improved electrical characteristic and a manufacturing method thereof.

The present disclosure also provides a pressure sensitive display device having a high sensitivity and a manufacturing method thereof.

The object of the present invention is not limited to the aforesaid, but other objects not described herein will be clearly understood by those skilled in the art from descriptions below.

An embodiment of the inventive concept provides a pressure sensitive display device including: a sensing substrate; a reaction substrate provided on the sensing substrate; and spacers provided between the sensing substrate and the reaction substrate to space the sensing substrate apart from the reaction substrate. Here, the sensing substrate includes: a flexible substrate; and a touch electrode provided on one surface of the flexible substrate, which faces the reaction substrate, and the reaction substrate includes: a transparent substrate; a transparent electrode provided on one surface of the transparent substrate, which faces the sensing substrate; and a light emitting layer disposed on the transparent electrode.

In an embodiment, the sensing substrate may be deformed by an external pressure so that the touch electrode contacts the light emitting layer, and the light emitting layer may emit light by the contact with the touch electrode.

In an embodiment, a contact area between the touch electrode and the light emitting layer may be substantially the same as a light emitting area of the light emitting layer.

In an embodiment, the touch electrode may be flexible.

In an embodiment, the pressure sensitive display device may further include an intermediate electrode provided between the flexible substrate and the touch electrode.

In an embodiment, the intermediate electrode may have a resistivity greater than that of the touch electrode.

In an embodiment, the touch electrode may have an electric conductivity that gradually decreases in a direction away from the flexible substrate.

In an embodiment, each of the spacers may have a line shape extending in one direction parallel to a top surface of the reaction substrate, and the spacers may be arranged in a stripe shape or an open ring shape provided on an outer portion of the reaction substrate on a plane.

In an embodiment, each of the spacers may have a column shape extending from a top surface of the reaction substrate to a bottom surface of the sensing substrate, and the spacers may be arranged in row and column on the top surface of the reaction substrate in terms of a plane.

In an embodiment, the sensing substrate may have a thickness about 1 μm to about 20 μm.

In an embodiment, the touch electrode may include a nanowire, a nanofiber, a nanoparticle, a graphene, or a nanotube.

In an embodiment, the touch electrode may include a complex in which a nanostructure made of a conductive material and a nanostructure made of a non-conductive material are mixed.

In an embodiment, the light emitting layer may include a quantum dot material or a perovskite material.

In an embodiment, the pressure sensitive display device may further include an electron injection layer provided on a first surface of the light emitting layer, which faces the touch electrode, or a hole injection layer provided on a second surface of the light emitting layer, which faces the transparent electrode.

In an embodiment, the pressure sensitive display device may further include a photo-diode or a transistor provided below the sensing substrate.

In an embodiment, the spacer may include a non-conductive adhesive material, and the touch electrode may be fixed by the spacer while being spaced apart from the light emitting layer.

In an embodiment of the inventive concept, a pressure sensitive display device includes: a transparent first substrate; a first electrode disposed on the first substrate; a light emitting layer disposed on the first electrode; and a second electrode disposed on the light emitting layer while being spaced apart from the light emitting layer. Here, the second electrode includes a flexible conductive material, and the second electrode is deformed by an external pressure to contact the light emitting layer, and a portion of the light emitting layer, which contacts the touch electrode, emits light.

In an embodiment, the pressure sensitive display device may further include spacers defining a space between the light emitting layer and the second electrode.

In an embodiment, each of the spacers may have a line shape extending in one direction parallel to a top surface of the first substrate, and the spacers may be arranged in a stripe shape or an open ring shape provided on an outer portion of the first substrate on a plane.

In an embodiment, each of the spacers may have a column shape extending from a top surface of the first substrate to a bottom surface of the second substrate, and the spacers may be arranged in row and column on the top surface of the first substrate in terms of a plane.

In an embodiment, the pressure sensitive display device may further include a third electrode provided on the second substrate, and the third electrode may have a resistivity greater than that of the second electrode.

In an embodiment, the second electrode may have an electric conductivity that gradually decreases in a direction toward the light emitting layer.

In an embodiment, the pressure sensitive display device may further include a second substrate disposed on the second electrode. Here, the second substrate may include a flexible substrate, and the second substrate may be deformed in conjunction with the second electrode when the external pressure is applied.

In an embodiment, the pressure sensitive display device may further include an electron injection layer provided on a first surface of the light emitting layer, which faces the second electrode, or a hole injection layer provided on a second surface of the light emitting layer, which faces the first electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
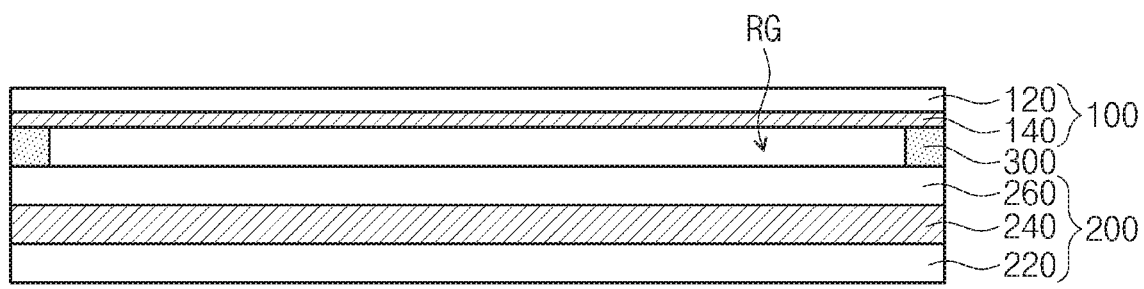
FIGS. 1 to 2 are cross-sectional views for explaining a pressure sensitive display device according to embodiments of the inventive concept.

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present disclosure. The terms of a singular form may include plural forms unless referred to the contrary. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. Like reference numerals refer to like elements throughout.

Unless terms used in embodiments of the present invention are differently defined, the terms may be construed as meanings that are commonly known to a person skilled in the art.

Figure 2:
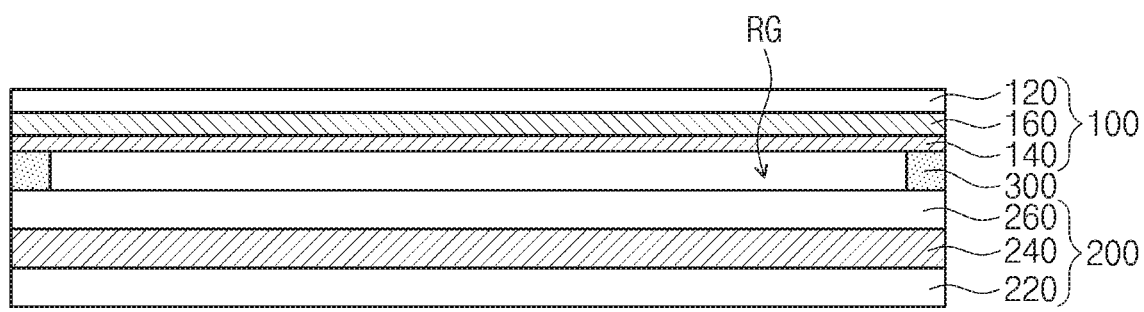
Figure 3:
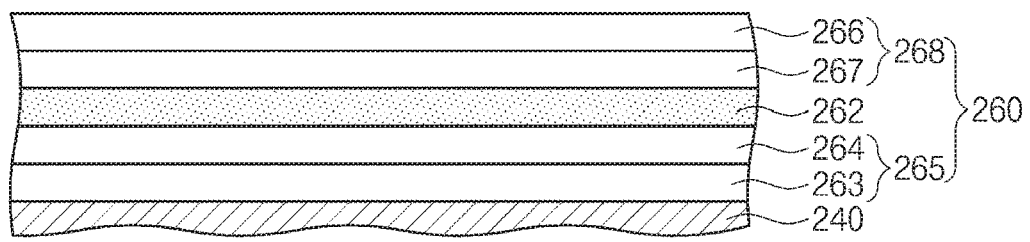
FIG. 3 is an enlarged view for explaining a configuration of a reaction substrate.

Hereinafter, a pressure sensitive display device according to an embodiment of the inventive concept will be described with reference to drawings. FIGS. 1 and 2 are cross-sectional views for explaining the pressure sensitive display device according to an embodiment of the inventive concept. FIG. 3 is an enlarged view for explaining a configuration of a reaction substrate. FIGS. 4 to 8 are plan views for explaining a shape of a spacer.

Referring to FIG. 1, the pressure sensitive display device may include a first substrate 100, a second substrate 200, and a spacer 300.

The first substrate 100 may be provided. The first substrate 100 may be a sensing substrate of the pressure sensitive display device. For example, the first substrate 100 may sense a pressure applied from the outside. The first substrate 100 may include a first sub-substrate 120 and a first electrode 140.

The first sub-substrate 120 may be provided. The first sub-substrate 120 may be a flexible substrate. For example, the first sub-substrate 120 may include polyimide (PI), polyethylene naphthalate (PEN), polycarbonate (PC), poly (ether sulfone) (PES), poly(ethylene terephthalate) (PET), poly(dimethyl sulfate) (PDMS), or ecoflex. Although not shown, the first sub-substrate 120 may include a protective layer provided on a top surface thereof. For example, the protective layer may be a single layer or multilayered thin-film including a silicon oxide (SiOx), a silicon nitride (SiNx), an aluminum oxide (AlOx), parylene, or an organic-inorganic hybrid layer.

The first electrode 140 may be disposed on a bottom surface of the first sub-substrate 120. The first electrode 140 may be a pressure sensitive electrode. For example, the first electrode 140 may have an electric conductivity varied by an external pressure. The first electrode 140 may include a nanostructure made of a conductive material. For example, the nanostructure may be one of a nanowire, a nanofiber, a nanoparticle, a graphene, or a nanotube. For example, the conductive material may include metal such as silver (Ag), a conductive material such as carbon (C), and a conductive polymer such as poly3,4-ethylenedioxythiophene:poly styrene sulfonate (PEDOT:PSS). Alternatively, the first electrode 140 may include a complex in which a nanostructure made of a conductive material and a nanostructure made of a non-conductive material are mixed. For example, the non-conductive material may include a zinc oxide (ZnO), a titanium oxide (TiO$_2$), or an organic material. Alternatively, the first electrode layer 140 may include a conductive polymer. For example, the conductive polymer may include pressure sensitive rubber (PSR). According to other embodiments, the first electrode 140 may have a different electric conductivity according to a position thereof. For example, the electric conductivity of the first electrode 140 may decrease in a direction away from the first sub-substrate 120.

Although one first electrode 140 is provided on one surface of the first sub-substrate 120 in FIG. 1, the embodiment of the inventive concept is not limited thereto. As illustrated in FIG. 2, a second electrode 160 may be provided between the first sub-substrate 120 and the first electrode 140. The second electrode 160 may have an electric conductivity greater than that of the first electrode 140. The second electrode 160 may include a metal thin-film such as gold (Au), silver (Ag), copper (Cu), or aluminum (Al) or a conductive polymer thin-film such as poly 3,4-ethylenedioxythiophene:poly styrene sulfonate (PEDOT:PSS). Alternatively, the second electrode 160 may include a nanostructure made of a conductive material.

The first substrate 100 may be deformed by an external pressure. That is, the first substrate 100 may be flexible. When the first substrate 100 is deformed, the first electrode 140 and the second electrode 160 in the first substrate 100 may be deformed together, and here, an electric conductivity of the first electrode 140 may be varied. The first substrate 100 may have a thickness of about 1 μm to about 20 μm. When the first substrate 100 has a thickness greater than about 20 μm, a deformed area of the first substrate 100 when an external pressure is applied may increase, and a sensitivity of the pressure sensitive display device may decrease. However, the embodiment of the inventive concept is not limited thereto. For example, electrical characteristics of the first substrate 100 may be varied by an external pressure even when the first substrate 100 has a thickness less than about 1 μm or greater than about 20 μm.

The second substrate 200 may be provided. The second substrate 200 may be a reaction substrate of the pressure sensitive display device. For example, the second substrate 200 may generate light at a position corresponding to the external pressure as a reaction to the external pressure. This will be described in detail later. The second substrate 200 may include a second sub-substrate 220, a third electrode 240, and a light emitting part 260.

The second sub-substrate 220 may be provided. The second sub-substrate 220 may be a transparent substrate. The second sub-substrate 220 may include a transparent material. For example, the second sub-substrate 220 may include glass, plastic, or elastomer. Although not shown, the second sub-substrate 220 may include a protective layer provided on a bottom surface thereof. For example, the protective layer may be a single layer or multilayered thin-film including a silicon oxide (SiOx), a silicon nitride (SiNx), an aluminum oxide (AlOx), parylene, or an organic-inorganic hybrid layer.

The third electrode 240 may be disposed on a top surface of the second sub-substrate 220. The third electrode 240 may be a transparent electrode. For example, the third electrode 240 may transmit light in a visible light range. The third electrode 240 may include a transparent conductive material. For example, the transparent conductive material may include an indium tin oxide (ITO), an indium zinc oxide (IZO), or an oxide-metal-oxide (OMO) thin-film. Alternatively, the third electrode 240 may include a nanostructure such as a nanowire, a nanofiber, a nonoparticle, a graphene, or a nanotube. Alternatively, the third electrode 240 may include a conductive polymer such as poly 3,4-ethylenedioxythiophene:poly styrene sulfonate (PEDOT:PSS).

The light emitting part 260 may be disposed on the third electrode 240. The third electrode 240 may be a positive electrode of the light emitting part. The light emitting part 260 may include a hole transport region 265 (refer to FIG. 3), a light emitting layer 262 (refer to FIG. 3), and an electron transport region 268 (refer to FIG. 3), which are sequentially laminated from the third electrode 240. Hereinafter, a configuration of the light emitting part 260 will be described in detail with reference to FIG. 3.

Referring to FIG. 3, the light emitting layer 262 may be provided on the third electrode 240. The light emitting layer 262 may generate light by using reunion of electrons or holes provided from the outside. The light emitting layer 262 may have a single layer structure made of a single material, a single layer structure made of a plurality of different materials, or a multilayered structure including a plurality of layers made of a plurality of different materials.

Although the light emitting layer 262 may be typically used for an organic light emitting diode (OLED), a quantum dot diode, or a perovskite, the embodiment of the inventive concept is not limited thereto. For example, the light emitting layer 262 may be an organic light emitting material including at least one of a polyfluorene derivative, a (poly) paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, or carbazole. Also, the light emitting layer may be an organic light emitting material including a dopant. For example, the dopant may include at least one selected from the group consisting of xanthene, perylene, cumarine, rhodamine, rubrene, dicyanomethylene pyran, thiopyran, (thia) pyrilium, a periflanthene derivative, an indenoperylene derivative, carbostyryl, nile red, and quinacridone.

Specifically, when the light emitting layer 262 emits red light, the light emitting layer 262 may include a fluorescent material containing, e.g., tris(dibenzoylmethanato) phenanthoroline europium (PBD:Eu(DBM)3(Phen)) or perylene, and the dopant material of the light emitting layer 262 may be selected from, e.g., a metal complex such as bis (1-phenylisoquinoline) acetylacetonate iridium (PIQIr (acac)), bis (1-phenylquinoline) acetylacetonate iridium (PQIr(acac)), tris (1-phenylquinoline) iridium (PQIr), and PtOEP (octaethylporphyrin platinum (PtOEP) or an organometallic complex.

When the light emitting layer 262 emits green light, the light emitting layer 262 may include a fluorescent material containing, e.g., tris(8-hydroxyquinolino)aluminum (Alq3), and the dopant material of the light emitting layer 262 may be selected from, e.g., a metal complex such as fac-tris (2-phenylpyridine) iridium (Ir(ppy)3) or an organometallic complex.

When the light emitting layer 262 emits blue light, the light emitting layer 262 may include one selected from the group consisting of, e.g., spiro-DPVBi (DPVBi), spiro-6P (-6P), distyryl-benzene (DSB), distyryl-arylene (DSA), polyfluorene (PFO)-based polymer, a poly (p-phenylene vinylene) (PPV)-based polymer, and a combination thereof, and the dopant material of the light emitting layer 262 may be selected from, e.g., a metal complex such as (4,6-F2ppy) 2Irpic or an organometallic complex.

The hole transport region 265 may be provided between the third electrode 240 and the light emitting layer 262. The hole transport region 265 may be a region through which a hole injected from the third electrode 240 passes to reach the light emitting layer 262.

The hole transport region 265 may include at least one of a hole injection layer 263, a hole transport layer 264, and a single layer having both a hole injection function and a hole transport function. The hole transport region 265 may be made of at least one of a hole injection material and a hole transport material.

When the hole transport region 265 includes the hole injection layer 263, the hole transport region 265 may include a phthalocyanine compound such as copper phthalocyanine, N,N'-diphenyl-N,N'-bis-[4-(phenyl-m-tolylamino)-phenyl]-biphenyl-4,4'-diamine (DNTPD), 4,4',4''-tris(3-methylphenylphenylamino) triphenylamine (m-MTDATA), 4,4'4''-Tris(N,N-diphenylamino)triphenylamine (TDATA), 4,4',4''-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), and polyaniline/poly(4-styrenesulfonate) (PANI/PSS). However, the embodiment of the inventive concept is not limited thereto.

When the hole transport region 265 includes the hole transport layer 264, the hole transport region 265 may include a carbazole-based derivative such as N-phenylcarbazole and polyvinylcarbazole, a fluorine-based derivative, a triphenylamine-based derivative such as N,N'-bis(3-methylphenyl)-N,N'-diphenyl-[1,1-biphenyl]-4,4'-diamine (TPD) and 4,4',4''-tris(N-carbazolyl)triphenylamine (TCTA), N,N'-di(1-naphthyl)-N,N'-diphenylbenzidine (NPB), and 4,4-bis[N,N-bis(4-methylphenyl) benzenamine] (TAPC). However, the embodiment of the inventive concept is not limited thereto.

The hole transport region 265 may have a thickness of about 100 Å to about 10000 Å. When the hole transport region 265 includes all of the hole injection layer 263 and the hole transport layer 264, the hole injection layer 263 may have a thickness of about 100 Å to about 10000 Å, and the hole transport layer 264 may have a thickness of about 50 Å to about 2000 Å. When each of the hole injection layer 263 and the hole transport layer 264 has a thickness within the above-described range, a satisfactory hole transport characteristic may be achieved without substantial increase in driving voltage.

The hole transport region 265 may further include a charge generating material to improve electric conductivity in addition to the above-described materials. The charge generating material may be uniformly or ununiformly dispersed in the hole transport region 265. For example, the charge generating material may be a p-dopant. Although the p-dopant may be one of a quinone derivative, a metal oxide, and a cyano group-containing compound, the embodiment of the inventive concept is not limited thereto. For example, a non-limiting example of the p-dopant may include a quinine derivative such as tetracyanoquinodimethane (TCNQ) and 2,3,5,6-tetrafluoro-tetracyanoquinodimethane (F4-TCNQ) and a metal oxide such as a tungsten oxide and a molybdenum oxide, the embodiment of the inventive concept is not limited thereto.

The electron transport region 268 may be disposed on the light emitting layer 262. The electron transport region 268 may be a region through which an electron injected from the first electrode 140 passes to reach the light emitting layer 262. Although the first electrode 140 and the light emitting part 260 are spaced apart from each other in a structure of FIG. 1, a contact operation between first electrode 140 and the light emitting part 260 will be described in detail later.

Although the electron transport region 268 may include at least one of a hole stop layer, an electron transport layer 267, and an electron injection layer 266, the embodiment of the inventive concept is not limited thereto. Although the electron transport region 268 may have, e.g., a structure of the electron transport layer 267/the electron injection layer 266 or the hole stop layer/the electron transport layer 267/the electron injection layer 266, which are sequentially laminated from the light emitting layer 262, or a single layer structure in which at least two layers of the above-described layers are combined with each other, the embodiment of the inventive concept is not limited thereto.

When the electron transport region 268 includes the electron transport layer 267, the electron transport region 268 may include Tris(8-hydroxyquinolinato)aluminum (Alq3), 1,3,5-Tri (1-phenyl-1H-benzo[d]imidazol-2-yl) phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1, O8)-(1,1'-Biphenyl-4-olato)aluminum (BAlq), berylliumbis (benzoquinolin-10-olate) (Bebq2), 9,10-di (naphthalene-2-yl) anthracene (ADN), and a mixture thereof. However, the embodiment of the inventive concept is not limited thereto.

The electron transport layer 267 may have a thickness of about 100 Å to about 1000 Å. When the electron transport layer has a thickness within the above-described range, a satisfactory electron transport characteristic may be achieved without substantial increase in driving voltage.

When the electron transport region 268 includes the electron injection layer 266, the electron transport region 268 may be made of lanthanum metal such as LiF, Lithium quinolate (LiQ), $Li_2O$, BaO, NaCl, CsF, and Yb or metal halides such as RbCl and RbI. The electron injection layer 266 may be made of a material in which the electron transport material and an insulating organo-metal salt are mixed. The organo-metal salt may be a material having an energy band gap of about 4 eV or more. For particular example, the organo-metal salt may include metal acetate, metal benzoate, metal acetoacetate, metal acetylacetonate or metal stearate.

The electron injection layer 266 may have a thickness of about 1 Å to about 100 Å. When the electron injection layer 266 has a thickness within the above-described range, a satisfactory electron injection characteristic may be achieved without substantial increase in driving voltage.

As described above, the electron transport region 268 may include the hole stop layer. Although the hole stop layer may include, e.g., at least one of 2,9-dimethyl-4,7-diphenyl-1, 10-phenanthroline (BCP) and 4,7-diphenyl-1,10-phenanthroline (Bphen), the embodiment of the inventive concept is not limited thereto. The hole stop layer may have a thickness of about 20 Å to about 1000 Å. When the hole stop layer has a thickness within the above-described range, a satisfactory hole stop characteristic may be achieved without substantial increase in driving voltage. The above-described light emitting part 260 may be provided.

Although a configuration of the light emitting part 260 including the hole transport region 265, the light emitting layer 262, and the electron transport region 268, which are sequentially laminated on the third electrode 240, the embodiment of the inventive concept is not limited thereto. Alternatively, the light emitting part 260 of the pressure sensitive display device according to embodiments of the inventive concept may include the electron transport region 268, the light emitting layer 262, and the hole transport region 265, which are laminated in an order reverse to that in FIG. 3. For example, the light emitting part 260 may have a configuration in which the electron transport region 268, the light emitting layer 262, and the hole transport region 265 are sequentially laminated on the third electrode 240. In this case, the electron injection layer 266, the electron transport layer 267, the light emitting layer 262, the hole transport layer 264, and the hole injection layer 263 may be sequentially laminated on the third electrode 240.

Referring to FIG. 1 again, the spacer 300 may be provided between the first substrate 100 and the second substrate 200. The spacer 300 may allow the first substrate 100 and the second substrate 200 to be spaced apart from each other. Here, the first substrate 100 and the second substrate 200 may be disposed so that the first electrode 140 of the first substrate 100 and the light emitting part 260 of the second substrate 200 face each other. Specifically, the spacer 300 may allow the first electrode 140 of the first substrate 100 and the light emitting part 260 of the second substrate 200 to be spaced apart from each other. Here, the light emitting part 260 may contact the third electrode 240 and be spaced apart from the first electrode 140. The third electrode 240 may be a positive electrode of the light emitting part 260, and the first electrode 140 may be a negative electrode of the light emitting part 260. That is, the light emitting part 260 may be connected to only the positive electrode. The spacer 300 may fix the first substrate 100 on the second substrate 200. For example, the spacer 300 may include a non-conductive adhesive material.

Figure 4:
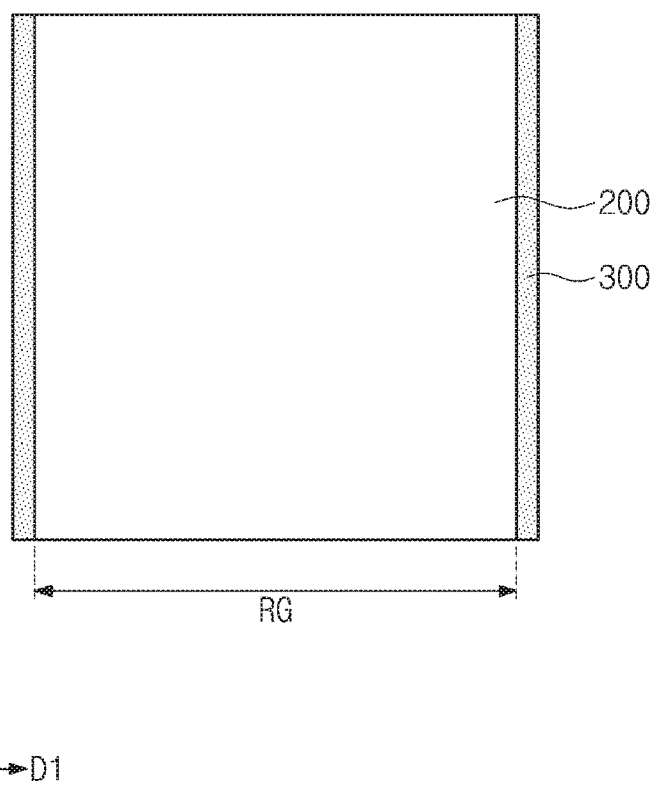
FIGS. 4 to 8 are plan views for explaining a shape of a spacer.
Figure 5:
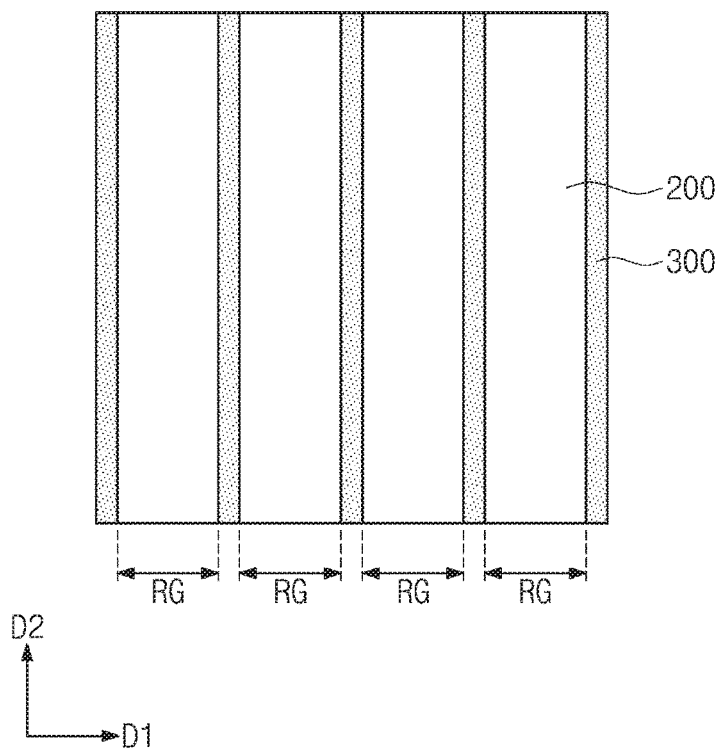

The spacer 300 may be provided in plurality. In terms of a plane, the spacers 300 may be provided on outer portions of the first substrate 100. A region RG (refer to FIGS. 4 and 5) surrounded by the spacers 300 between the first substrate 100 and the second substrate 200 may be defined as a sensing region for sensing an external pressure. The spacers 300 may have a line shape provided on each of both ends of the second substrate 200. For example, as illustrated in FIG. 4, the spacers 300 may be provided on the both ends of the second substrate 200 in a first direction D1 and extend in a second direction D2 perpendicular to the first direction D1. Also, the spacers 300 may be arranged in a stripe shape. For example, as illustrated in FIG. 5, the spacers 300 may extend on the second substrate 200 in the second direction D2 and periodically arranged in the first direction D1.

According to another embodiment, one spacer 300 may be provided on an outer portion ER (refer to FIG. 6) of the second substrate 200.

Figure 6:
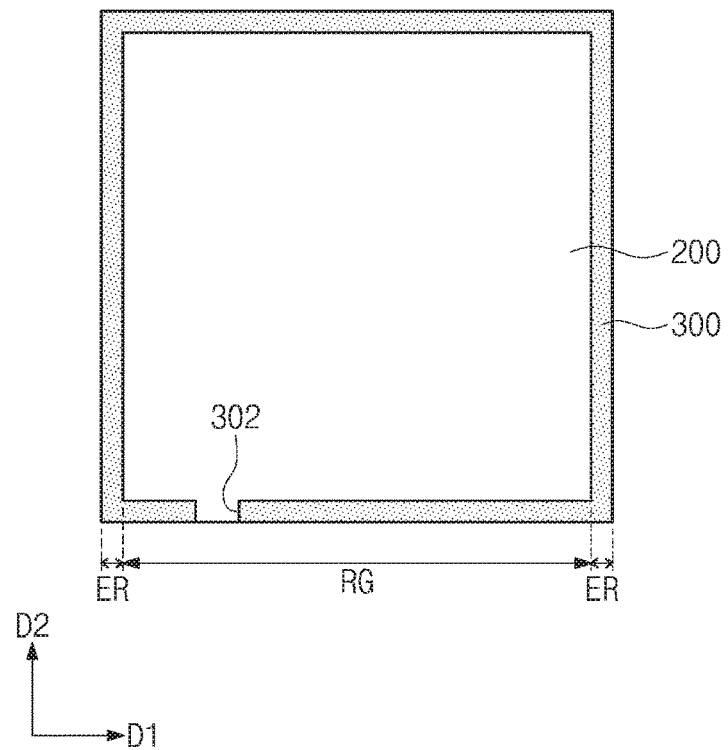

For example, as illustrated in FIG. 6, the spacer 300 may be disposed on the outer portion ER of the second substrate 200 to surround a space between the first substrate 100 and the second substrate 200.

That is, the spacer 300 may have an open ring shape along the outer portion ER of the second substrate 200. For example, the spacer 300 may include a communication portion 302 connected to the space between the first substrate 100 and the second substrate 200 while surrounding the first substrate 100 and the second substrate 200. Thus, when the first substrate 100 is deformed by an external pressure, air or gases in the space between the first substrate 100 and the second substrate 200 may be discharged through the communication portion 302. When the external pressure is removed from the first substrate 100, and the first substrate 100 is returned to an original shape, air or gases may be introduced through the communication portion 302 between the first substrate 100 and the second substrate 200. Thus, although the external pressure is applied and removed, the space between the first substrate 100 and the second substrate 200 may maintain a constant pressure, and the pressure sensitive display device may not be damaged by a pressure difference. In terms of a plane, the inner region RG of the spacer 300 may be defined as a sensing region for sensing the external pressure. Although not shown, the spacer 300 may have a grid shape that divides the space between first substrate 100 and the second substrate 200.

Figure 7:
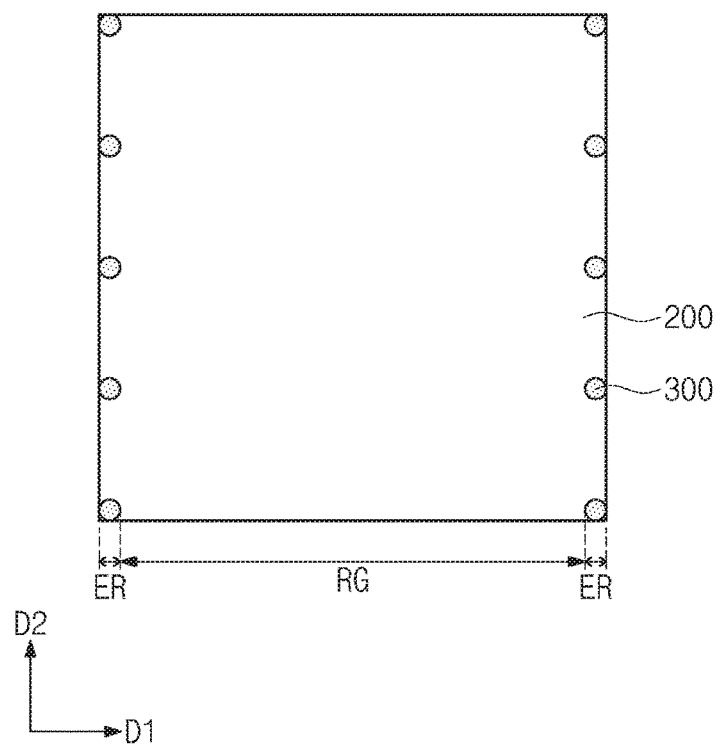
Figure 8:
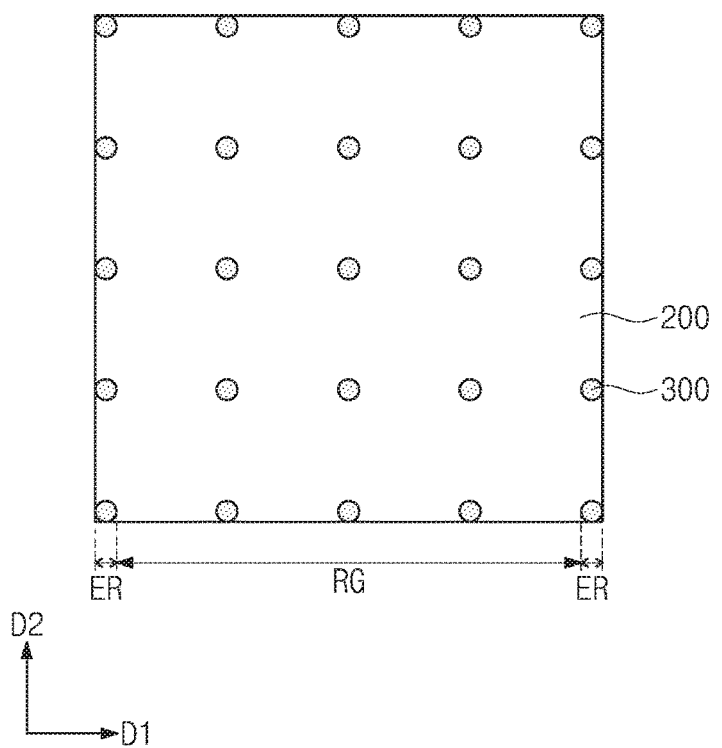

According to another embodiment, the spacer 300 having a pillar shape may be provided in plurality. The spacers 300 each may extend from the top surface of the second substrate 200 to the bottom surface of the first substrate 100. The spacers 300 may be provided on the outer portion ER of the second substrate 200. For example, as illustrated in FIG. 7, the spacers 300 may extend on the second substrate 200 in the second direction D2 and periodically arranged in the first direction D1. Alternatively, the spacers 300 may be arranged in row and column on the second substrate 200. For example, as illustrated in FIG. 8, the spacers may be arranged in the first direction D1 and the second direction D2.

The above-described pressure sensitive display device may be provided. Hereinafter, an operation of the pressure sensitive display device according to the embodiments of the inventive concept will be described with reference to FIGS. 1 and 9 to 11.

Figure 9:
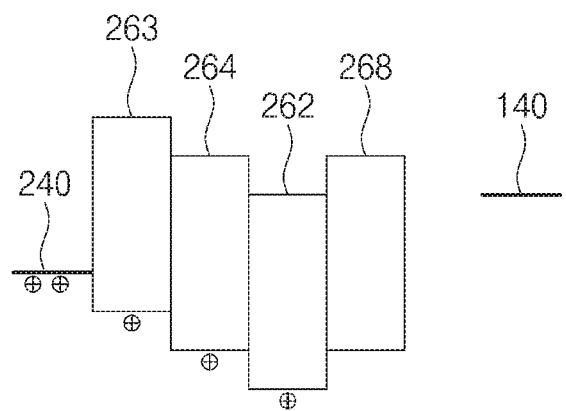
FIG. 9 is a band diagram of the pressure sensitive display device according to the embodiments of the inventive concept.
Figure 10:
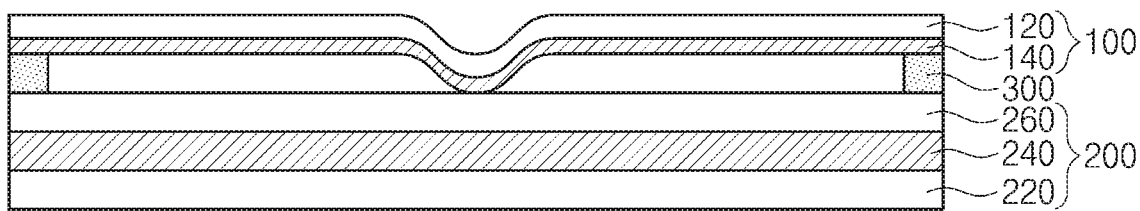
FIG. 10 is a cross-sectional view for explaining an operation of the pressure sensitive display device according to the embodiments of the inventive concept.
Figure 11:
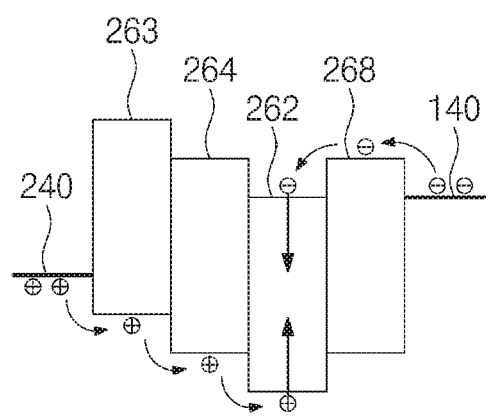
FIG. 11 is a band diagram for explaining the operation of the pressure sensitive display device according to the embodiments of the inventive concept.

FIG. 9 is a band diagram of the pressure sensitive display device according to the embodiments of the inventive concept. FIG. 10 is a cross-sectional view for explaining an operation of the pressure sensitive display device according to the embodiments of the inventive concept. FIG. 11 is a band diagram for explaining the operation of the pressure sensitive display device according to the embodiments of the inventive concept.

FIGS. 1 and 9 illustrate a state in which an external pressure is not applied to the pressure sensitive display device.

The light emitting part 260 may include layers having different energy bands. In general, an organic material has a molecular binding force that is relatively extremely weaker than an ionic bonding force, etc. Thus, an electron energy level of an organic layer is quantized and shown as an energy band having a predetermined gap. An energy band of an organic layer may be defined by a gap between a lowest unoccupied molecular orbital (LUMO) energy level and a highest occupied molecular orbital (HOMO) energy level. The LUMO energy level, which a lowest energy level at which an electron is not filled, may correspond to a lower end energy level of a conduction band of an inorganic semiconductor. The LUMO energy level corresponds to an electron affinity of a corresponding layer.

As illustrated in FIG. 1, when an external pressure is not applied to the first substrate 100, the first electrode 140 of the first substrate 100 may be spaced apart from the light emitting part 260 of the second substrate 200. That is, as illustrated in FIG. 9, an electrical signal may not be applied from the first electrode 140 to the light emitting part 260, and light may not be generated from the light emitting part 260.

FIGS. 10 and 11 show a state in which an external pressure is applied to the pressure sensitive display device.

When a predetermined electric field is applied to the light emitting layer 262, electrons existing at the first electrode 140 (the negative electrode) move to an adjacent layer by the electric field. Here, as a gap between LUMO energy levels of adjacent layers increases, an electric field increases.

The LUMO energy level is related to a movement of electrons. The electrons may move from a layer having a low LUMO energy level to a layer having a high LUMO energy level by the applied electric field. In general, the electron transport region 268 has a LUMO energy level between a work function of the first electrode 140 and a LUMO energy level of the light emitting layer. Also, when the electron transport region 268 includes a plurality of layers, LUMO energy levels may increase in a direction from the first electrode 140 to the light emitting layer 262. However, the embodiment of the inventive concept is not limited thereto. The HOMO energy level is a highest energy level at which electrons are filled. The HOMO energy level may correspond to an upper end energy level of a valence band of an inorganic semiconductor. A layer has an energy level corresponding to ionization potential. The ionization potential is an energy required for ionization of a material. As the ionization potential increases, the ionization of the material is more difficult.

When a predetermined electric field is applied to the light emitting layer 262 of the light emitting part 260, holes existing at the third electrode 240 (the positive electrode) move to an adjacent layer by the electric field. Here, as a gap between HOMO energy levels of adjacent layers increases, a greater electric field is required.

The HOMO energy level is related to a movement of holes. The holes may move from a layer having a high HOMO energy level to a layer having a low HOMO energy level by the applied electric field. In general, the hole transport region 263 and 264 has a HOMO energy level between a work function of the third electrode 240 and a HOMO energy level of the light emitting layer 262. Also, when the hole transport region 263 and 264 includes a plurality of layers, HOMO energy levels may decrease in a direction from the third electrode 240 to the light emitting layer 262. However, the embodiment of the inventive concept is not limited thereto.

As illustrated in FIG. 10, the first substrate 100 may be deformed by an external pressure to contact the second substrate 200. For example, the first electrode 140 of the deformed first substrate 100 may contact the light emitting part 260 of the second substrate 200. Here, as a shape of the first electrode 140 of the first substrate 100 is deformed and compressed, an electric conductivity of the first electrode 140 may be varied, and a charge (e.g., an electron) may be generated in the first electrode 140. As illustrated in FIG. 11, the charge generated in the first electrode 140 may be transmitted to the light emitting layer 262. Thus, a predetermined electric field may be applied to the light emitting layer 262 between the first electrode 140 and the third electrode 240.

An electron generated in the first electrode 140 may pass through the electron transport region 268. The electron may reach the light emitting layer 262. A hole of the third electrode 240 may pass through the hole transport region 263 and 264. The hole may reach the light emitting layer 262. The electron and the hole may be coupled at the light emitting layer 262. Light may be generated from the light emitting layer 262 by the coupling of the electron and the hole. The light generated as described above may be discharged in a downward direction of the second substrate 200 through the second sub-substrate 220.

According to the embodiments of the inventive concept, the pressure applied to the pressure sensitive display device may be converted into light. Here, the pressure may be sensed by using one electrode of the light emitting part 260. That is, the pressure sensitive display device according to an embodiment of the inventive concept may not require an additional intermediate component (e.g., a driving circuit, etc.), which senses the pressure to convert the sensed pressure into an electrical signal and transmits the electrical signal to the light emitting part 260 again. That is, the pressure sensitive display device may have a simple configuration and thus have a small thickness. Also, since the intermediate component is not required, an electrical distance between the first substrate 100 for sensing a pressure and the second substrate 200 for generating light may be small, and an electrical characteristic of the pressure sensitive display device may improve.

According to the embodiments, as the pressure applied to the first electrode 140 increases, an amount of charges generated in the first electrode 140 may increase. For example, as the external pressure increases, the amount of the charges generated in the first electrode 140 may increase, and an amount of light generated from the light emitting layer 262 may increase. That is, an intensity of the generated light may be varied according to an intensity of the external pressure, and the pressure sensitive display device according to an embodiment of the inventive concept may measure the intensity of the external pressure by using the intensity of the light.

Figure 12:
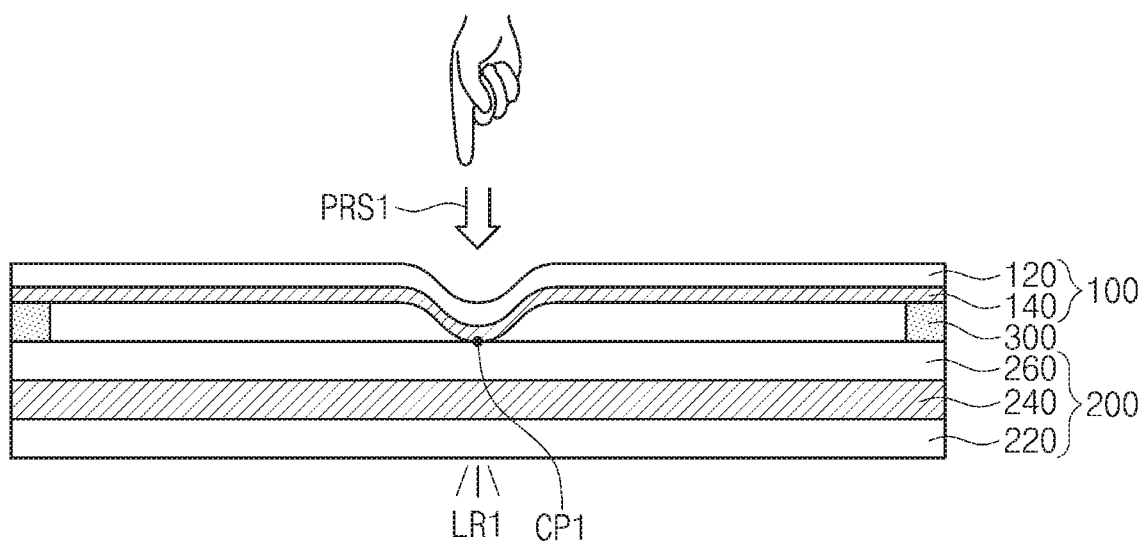
FIGS. 12 to 14 are cross-section views for explaining an operation region of the pressure sensitive display device according to the embodiments of the inventive concept.
Figure 13:
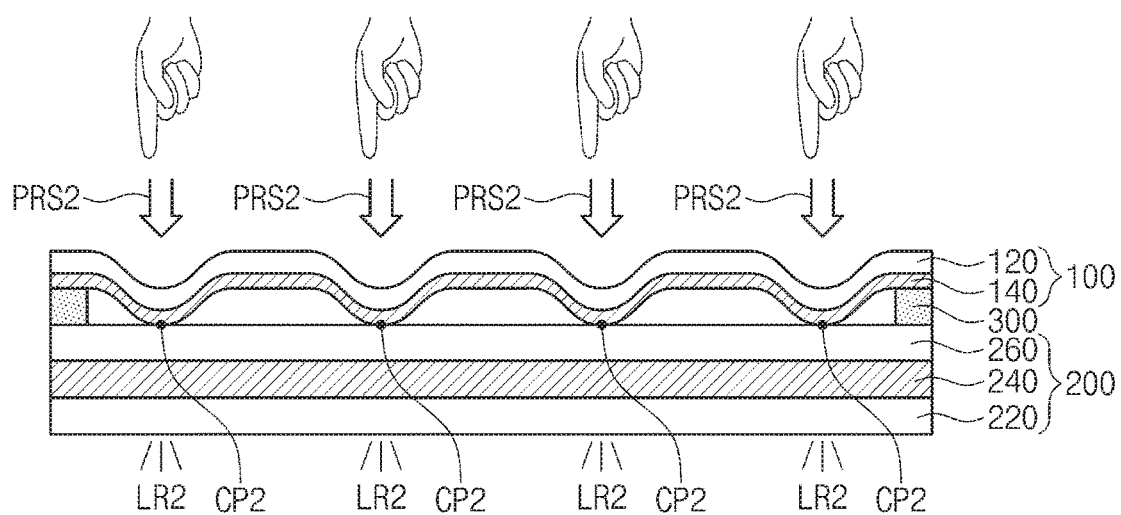
Figure 14:
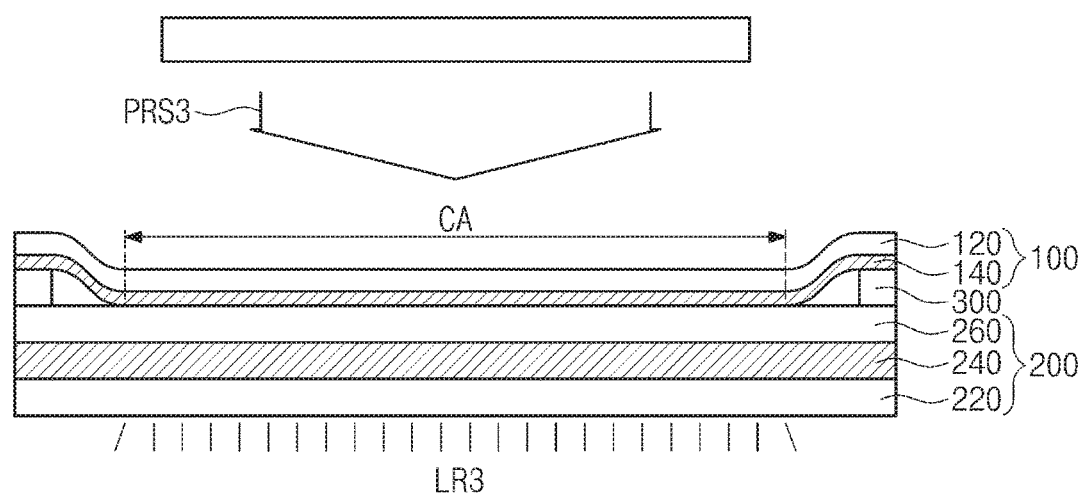

The pressure sensitive display device according to an embodiment of the inventive concept may generate light at a point of the second substrate corresponding to a point of the first substrate, to which the pressure is applied. FIGS. 12 to 14 are cross-sectional views for explaining an operation region of the pressure sensitive display device according to the embodiments of the inventive concept.

Referring to FIG. 12, a first external input PRS1 may be applied on a first point CP1. For example, the first point CP1 may be one point of the first substrate 100 (or one point of the second substrate 200). The first external input PRS1 may include a touch caused by a user's finger or a touch caused by a stylus. The first substrate 100 may be deformed at the first point CP1 by the first external input PRS1. The first substrate 100 may contact the second substrate 200 at the first point CP1, and the first substrate 100 may be spaced apart from the second substrate 200 at the rest area except for the first point CP1. The first point CP1 may correspond perpendicularly to the position to which the first external input PRS1 is provided. Thus, a current flow, which flows from the first electrode 140, through the light emitting part 260, to the third electrode 240, may be generated at the first point CP1, and first light LR1 may be discharged through the second sub-substrate 220 at the first point CP1. That is, a position at which the first light LR1 is discharged may correspond perpendicularly to a position of a touch caused by a finger, a stylus, etc., and light may not be generated at the rest area at which the first input PRS1 is not provided.

According to the embodiments of the inventive concept, a circuit of the first electrode 140, the light emitting part 260, and the third electrode 240 may be configured at only the position at which the external input is applied. Thus, light may be real-time generated at the position corresponding to the external input, and the position of the external input may exactly coincide to the generation position of the light. That is, the pressure sensitive display device having a high sensitivity may be provided.

Referring to FIG. 13, second external inputs PRS2 may be simultaneously applied on a plurality of second points CP2. For example, the second points CP2 may be a plurality of points that are spaced apart from each other on the first substrate 100. The second external input2 PRS2 may include a touch caused by a user's finger or a touch caused by a stylus. The first substrate 100 may be deformed at the second points CP2 by the second external inputs PRS2. The first substrate 100 may partially contact the second substrate 200 at the second points CP2, and the first substrate 100 may be spaced apart from the second substrate 200 at the rest area except for the second points CP2. The second points CP2 may correspond perpendicularly to the position to which the second external input2 PRS2 are provided. Thus, second light LR2 may be discharged through the second sub-substrate 220 at the second points CP2. That is, positions at which the second light LR2 is discharged may correspond perpendicularly to positions of touches caused by a finger, a stylus, etc., and light may not be generated at the rest area at which the second inputs PRS2 are not provided.

According to the embodiments of the inventive concept, the first substrate 100 may be deformed at only the positions to which the plurality of external inputs are applied. Thus, the plurality of external inputs may be easily sensed, and the pressure sensitive display device having a high sensitivity may be provided.

Referring to FIG. 14, a third external input PRS3 may be applied on a contact area CA having a wide area. For example, the contact area CA may be an area provided at a central portion of the first substrate 100 (or an area provided at a central portion of the second substrate 200). The a third external input PRS3 may be provided by a member or an input device having a large area such as a user's palm, a touch brush, or touch plate. The first substrate 100 may be deformed on the contact area CA by the third external input PRS3. Here, the first substrate 100 may be deformed in correspondence to a shape of the input device applying the third external input PRS3. For example, the first substrate 100 may contact the second substrate 200 over the entire contact area CA. The contact area CA may overlap perpendicularly to an area to which the third external input PRS3 is provided. Thus, a current flow, which flows from the first electrode 140, through the light emitting part 260, to the third electrode 240, may be provided over the entire contact area CA, and third light LR3 may be discharged through the second sub-substrate 220 over the entire contact area CA. That is, a position at which the third light LR3 is discharged may correspond to an area to which the third external input PRS3 is applied. When the external input is applied to a wide area like the contact area CA, a pressure applied to the first electrode 140 may be small. In this case, the third light LR3 generated in the light emitting part 260 may have a low brightness.

Figure 15:
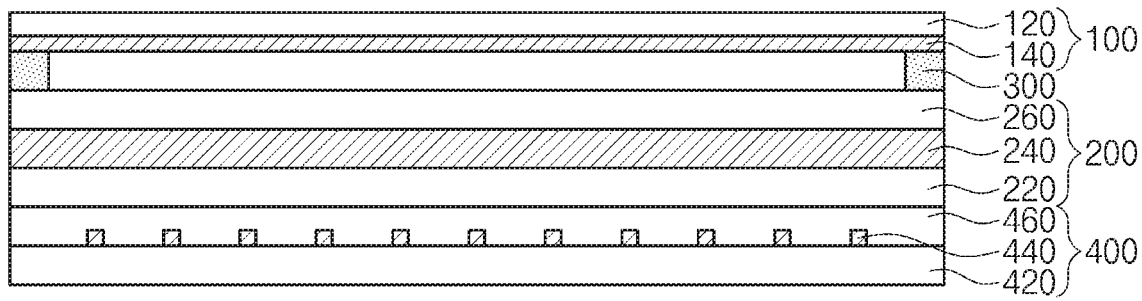
FIGS. 15 to 16 are cross-sectional views for explaining the pressure sensitive display device according to the embodiments of the inventive concept.
Figure 16:
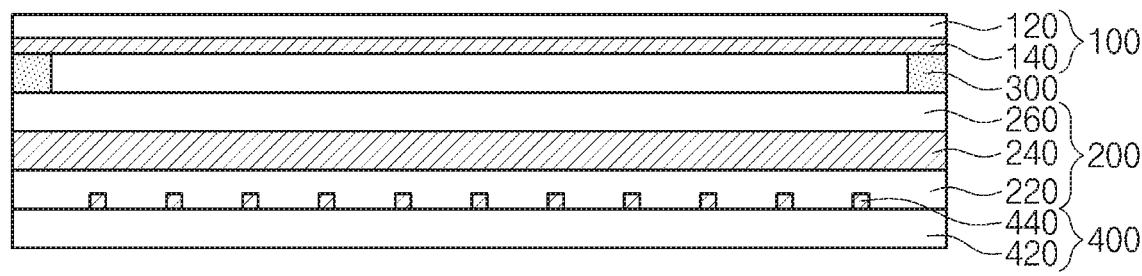

FIGS. 15 to 16 are cross-sectional views for explaining a pressure sensitive display device according to the embodiments of the inventive concept.

Referring to FIG. 15, the pressure sensitive display device may further include a third substrate 400 provided below the second substrate 200. The third substrate 400 may sense light generated in the second substrate 200. The third substrate 400 may include a third sub-substrate 420, an image sensor element 440, and a protective layer 460.

The third sub-substrate 420 may be a semiconductor substrate. For example, the third sub-substrate 420 may be a bulk silicon substrate, a silicon on insulator (SOI) substrate, a germanium substrate, a germanium on insulator (GOI) substrate, a silicon-germanium substrate, a group 3-5 compound semiconductor substrate, or a substrate of an epitaxial thin layer obtained by performing a selective epitaxial growth (SEG).

At least one image sensor element 440 may be provided on the third sub-substrate 420. The image sensor elements 440 may be provided on a top surface of the third sub-substrate 420. The image sensor elements 440 may be spaced apart from each other in a direction parallel to the top surface of the third sub-substrate 420. For example, although not shown, the image sensor elements 440 may be arranged in row and column on the third sub-substrate 420. The image sensor elements 440 may sense light emitted from points of the second substrate 200 corresponding to arranged positions thereof. Thus, the third sub-substrate 420 may sense a position of the first substrate 100, to which an external pressure is applied, and generate an electrical signal. The image sensor elements 440 may be a CMOS image sensor device or a charge coupled device. For example, the image sensor elements 440 may include a photo-diode or a transistor.

The protective layer 460 may be provided on the third sub-substrate 420. The protective layer 460 may cover the image sensor elements 440 on the top surface of the third sub-substrate 420. A top surface of the protective layer 460 may contact a bottom surface of the second substrate 200. The protective layer 460 may include a transparent insulating material.

According to other embodiments, the protective layer 460 may not be provided. For example, as illustrated in FIG. 16, the third sub-substrate 420 may directly contact a bottom surface of the second sub-substrate 220. Here, the image sensor elements 440 may be embedded in the second sub-substrate 220.

Figure 17:
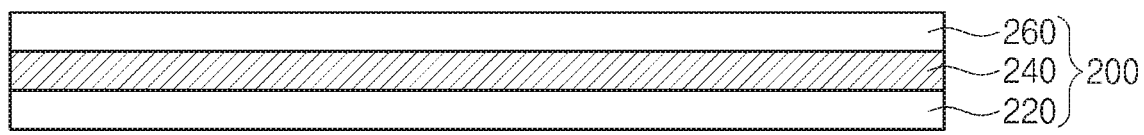
FIGS. 17 to 20 are cross-sectional views for explaining a method for manufacturing the pressure sensitive display device according to the embodiments of the inventive concept.
Figure 18:
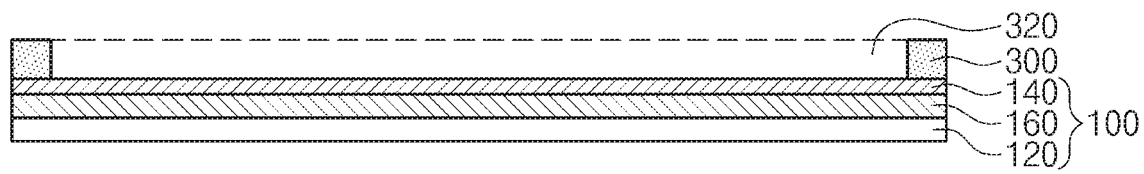

FIGS. 17 to 18 are cross-sectional views for explaining a method for manufacturing the pressure sensitive display device according to the embodiments of the inventive concept.

Referring to FIG. 17, the second substrate 200 may be formed. For example, the second substrate 200 may be formed by sequentially laminating the third electrode 240 and the light emitting part 260 on the second sub-substrate 220.

The second sub-substrate 220 may be provided. The second sub-substrate 220 may be a transparent substrate. The second sub-substrate 220 may include a transparent material. For example, the second sub-substrate 220 may include glass, plastic, or elastomer.

The third electrode 240 may be disposed on the second sub-substrate 220. The third electrode 240 may include a transparent conductive material. For example, the transparent conductive material may include an indium tin oxide (ITO), an indium zinc oxide (IZO), or an oxide-metal-oxide (OMO) thin-film.

The light emitting layer 260 may be formed on the third electrode 240. Specifically, the hole transport region 265 (refer to FIG. 3) may be formed on the third electrode 240. The hole transport region 265 may be formed by using various methods such as a vacuum deposition method, a spin coating method, a casting method, a Langmuir-Blodgett (LB) method, an inject printing method, a laser printing method, and a laser induced thermal imaging (LITI) method. The light emitting layer 262 (refer to FIG. 3) may be formed on the hole transport region 265. The light emitting layer 262 may be formed by using various methods such as a vacuum deposition method, a spin coating method, a casting method, a Langmuir-Blodgett (LB) method, an inject printing method, a laser printing method, and a laser induced thermal imaging (LITI) method. The electron transport region 268 (refer to FIG. 3) may be formed on the light emitting layer 262. The electron transport region 268 may be formed by using various methods such as a vacuum deposition method, a spin coating method, a casting method, a Langmuir-Blodgett (LB) method, an inject printing method, a laser printing method, and a laser induced thermal imaging (LITI) method. As described above, the light emitting part 260 may be formed by sequentially laminating the hole transport region 265, the light emitting layer 262, and the electron transport region 268 on the third electrode 240.

Referring to FIG. 18, the first substrate 100 may be formed. For example, the first substrate 100 may be formed by sequentially laminating the second electrode 160 and the first electrode 140 on the first sub-substrate 120.

The first sub-substrate 120 may be provided. The first sub-substrate 120 may be a flexible substrate. The first sub-substrate 120 may include a flexible insulating material. For example, the first sub-substrate 120 may include polyimide (PI), polyethylene naphthalate (PEN), polycarbonate (PC), poly(ether sulfone) (PES), poly(ethylene terephthalate) (PET), poly(dimethyl sulfate) (PDMS), or ecoflex.

The second electrode 120 may be formed on the first sub-substrate 120. The second electrode 160 may be formed by depositing or applying a conductive material on one surface of the first sub-substrate 120. For example, the conductive material may include metal such as gold (Au), silver (Ag), copper (Cu), titanium (Ti), molybdenum (Mo), or aluminum (Al) or a conductive polymer such as poly 3,4-ethylenedioxythiophene:poly styrene sulfonate (PEDOT:PSS).

The first electrode 140 may be formed on the second electrode 160. The first electrode 140 may be formed by applying a precursor material containing a nanostructure material on the second electrode 160 and then curing the precursor material. Alternatively, the first electrode 140 may be formed by directly injecting or applying the nanostructure material on the second electrode 160.

According to another embodiment, the second electrode 160 may not be formed on the basis of necessity. For example, the first electrode 140 may be formed on one surface of the first sub-substrate 120. In this case, the pressure sensitive display device according to the embodiment of FIG. 1 may be manufactured. Hereinafter, the method will continue to be described with reference to a case of forming the second electrode 160.

The spacer 300 may be formed on the first substrate 100. The spacer 300 may be formed on the first electrode 140 of the first substrate 100. For example, the spacer 300 may be formed by forming an adhesive layer on the first electrode 140 and then removing a portion (320) of the adhesive layer. Here, an area from which the portion 320 of the adhesive layer is removed may be defined as a sensing area for sensing an external pressure in the pressure sensitive display device. Alternatively, the spacer 300 may be formed by attaching an adhesive tape on a partial area of the first electrode 140.

Referring to FIG. 2 again, the first substrate 100 and the second substrate 200 may be bonded to each other. Specifically, the first substrate 100 and the second substrate 200 may be aligned so that the first electrode 140 of the first substrate 100 faces the light emitting part 260 of the second substrate 200. The first substrate 100 and the second substrate 200 may be attached by the spacer 300. Here, the second substrate 200 may be attached to the first substrate 100 while being spaced apart from the first substrate 100. The pressure sensitive display device according to the embodiment of FIG. 2 may be manufactured as described above.

Figure 19:
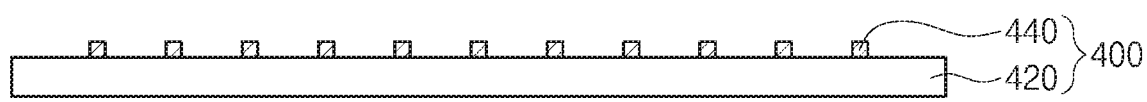
Figure 20:
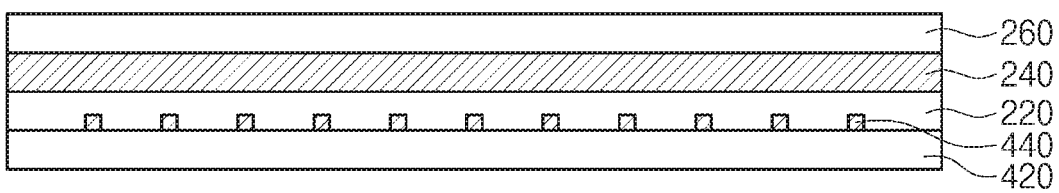

FIGS. 19 to 20 are cross-sectional views for explaining a method for manufacturing the pressure sensitive display device according to the embodiments of the inventive concept.

Referring to FIG. 19, the third substrate 400 may be formed. For example, the image sensor elements 440 may be formed on the third sub-substrate 420.

The third sub-substrate 420 may be provided. The third sub-substrate 420 may be a semiconductor substrate. For example, the third sub-substrate 420 may be a bulk silicon substrate, a silicon on insulator (SOI) substrate, a germanium substrate, a germanium on insulator (GOI) substrate, a silicon-germanium substrate, a group 3-5 compound semiconductor substrate, or a substrate of an epitaxial thin layer obtained by performing a selective epitaxial growth (SEG).

The image sensor elements 440 may be formed on the third sub-substrate 420. The plurality of image sensor elements 440 may be formed by performing a plurality of processes on a front surface of the third sub-substrate 420. The image sensor elements 440 may include a photo-diode or a transistor. The transistor or the photo-diode may be formed through a fabrication (FAB) process.

Referring to FIG. 20, the second substrate 200 may be formed on the third substrate 400. Specifically, the second substrate 200 may be formed by sequentially laminating the second sub-substrate 220, the third electrode 240, and the light emitting part 260 on the third sub-substrate 420.

The second sub-substrate 220 may be formed. For example, the second sub-substrate 220 may be formed by applying a transparent insulating material on the third sub-substrate 420 and then curing the transparent insulating material. The transparent insulating material may be applied to cover the image sensor elements 440 on the third sub-substrate 420. For example, the transparent insulating material may include plastic or elastomer.

The third electrode 240 and the light emitting part 260 may be formed on the second sub-substrate 220. A process of forming the third electrode 240 and the light emitting part 260 may be the same as or similar to that described with reference to FIG. 17.

Referring to FIG. 15 again, the first substrate 100 may be attached on the second substrate 200. For example, the first substrate 100 and the spacer 300 on the first substrate 100 may be formed. A process of forming the first substrate 100 and the spacer 300 may be the same as or similar to that described with reference to FIG. 18. The first substrate 100 and the second substrate 200 may be bonded to each other. Specifically, the first substrate 100 and the second substrate 200 may be aligned so that the first electrode 140 of the first substrate 100 faces the light emitting part 260 of the second substrate 200. The first substrate 100 and the second substrate 200 may be attached by the spacer 300. Here, the second substrate 200 may be attached to the first substrate 100 while being spaced apart from the first substrate 100. The pressure sensitive display device according to the embodiment of FIG. 15 may be manufactured as described above.

According to other embodiments, the protective layer 460 may be formed on the third sub-substrate 420. The image sensor elements 440 may be formed on the third sub-substrate 420, and then the protective layer 460 may be formed on the third sub-substrate 420 to cover the image sensor elements 440. For example, the protective layer 460 may be formed by applying a transparent insulating material on the third sub-substrate 420 to cover the image sensor elements 440 and then curing the transparent insulating material. In this case, the pressure sensitive display device according to the embodiment of FIG. 16 may be manufactured.

The pressure sensitive display device according to the embodiments of the inventive concept may not require the additional intermediate component for sensing a pressure to convert the sensed pressure into an electrical signal and transmitting the electrical signal to the light emitting part again. Thus, the pressure sensitive display device may have the simple configuration and have the small thickness. Also, as the intermediate component is not required, the electrical characteristic of the pressure sensitive display device may improve. Furthermore, the intensity of the generated light may be varied according to the intensity of the external pressure, and the pressure sensitive display device may measure the intensity of the external pressure by using the intensity of the light.

The pressure sensitive display device according to the embodiments of the inventive concept may real-time generate the light at the position corresponding to the external input, and the position of the external input may exactly coincide with the generated position of the light. That is, the pressure sensitive display device having the high sensitivity may be provided. Also, the pressure sensitive display device may easily sense the plurality of external inputs, and the pressure sensitive display device having the high sensitivity may be provided.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A pressure sensitive display device comprising:
   a sensing substrate;
   a reaction substrate provided on the sensing substrate; and
   spacers provided between the sensing substrate and the reaction substrate to space the sensing substrate apart from the reaction substrate,
   wherein the sensing substrate comprises:
      a flexible substrate; and
      a touch electrode provided on one surface of the flexible substrate, which faces the reaction substrate, and
   the reaction substrate comprises:
      a transparent substrate;
      a transparent electrode provided on one surface of the transparent substrate, which faces the sensing substrate; and
      a light emitting layer disposed on the transparent electrode;
   wherein the touch electrode has an electric conductivity that gradually decreases in a direction away from the flexible substrate.

2. The pressure sensitive display device of claim 1, wherein the sensing substrate is deformed by an external pressure so that the touch electrode contacts the light emitting layer, and
   the light emitting layer emits light by the contact with the touch electrode.

3. The pressure sensitive display device of claim 2, wherein a contact area between the touch electrode and the light emitting layer is substantially the same as a light emitting area of the light emitting layer.

4. The pressure sensitive display device of claim 1, wherein the touch electrode has flexibility.

5. The pressure sensitive display device of claim 1, further comprising an intermediate electrode provided between the flexible substrate and the touch electrode.

6. The pressure sensitive display device of claim 5, wherein the intermediate electrode has a resistivity greater than that of the touch electrode.

7. The pressure sensitive display device of claim 1, wherein each of the spacers have a line shape extending in one direction parallel to a top surface of the reaction substrate, and
   the spacers are arranged in a stripe shape or an open ring shape provided on an outer portion of the reaction substrate on a plane.

8. The pressure sensitive display device of claim 1, wherein each of the spacers have a column shape extending from a top surface of the reaction substrate to a bottom surface of the sensing substrate, and
   the spacers are arranged in row and column on the top surface of the reaction substrate in terms of a plane.

9. The pressure sensitive display device of claim 1, wherein the sensing substrate has a thickness about 1 µm to about 20 µm.

10. The pressure sensitive display device of claim 1, wherein the touch electrode comprises a nanowire, a nanofiber, a nanoparticle, a graphene, or a nanotube.

11. The pressure sensitive display device of claim 10, wherein the touch electrode comprises a complex in which a nanostructure made of a conductive material and a nanostructure made of a non-conductive material are mixed.

12. The pressure sensitive display device of claim 1, wherein the light emitting layer comprises a quantum dot material or a perovskite material.

13. The pressure sensitive display device of claim 1, further comprising an electron injection layer provided on a first surface of the light emitting layer, which faces the touch electrode, or
   a hole injection layer provided on a second surface of the light emitting layer, which faces the transparent electrode.

14. The pressure sensitive display device of claim 1, further comprising a photo-diode or a transistor provided below the sensing substrate.

15. The pressure sensitive display device of claim 1, wherein the spacer comprises a non-conductive adhesive material, and
   the touch electrode is fixed by the spacer while being spaced apart from the light emitting layer.

16. A pressure sensitive display device comprising:
   a transparent first substrate;
   a first electrode disposed on the first substrate;

a light emitting layer disposed on the first electrode; and a second electrode disposed on the light emitting layer while being spaced apart from the light emitting layer, wherein the second electrode comprises a flexible conductive material, and the second electrode is deformed by an external pressure to contact the light emitting layer, and a portion of the light emitting layer, which contacts the touch electrode, emits light; and wherein the second electrode has an electric conductivity that gradually decreases in a direction toward the light emitting layer.

17. The pressure sensitive display device of claim 16, further comprising spacers defining a space between the light emitting layer and the second electrode.

18. The pressure sensitive display device of claim 17, wherein each of the spacers have a line shape extending in one direction parallel to a top surface of the first substrate, and the spacers are arranged in a stripe shape or an open ring shape provided on an outer portion of the first substrate on a plane.

19. The pressure sensitive display device of claim 17, wherein each of the spacers have a column shape extending from a top surface of the first substrate to a bottom surface of the second substrate, and the spacers are arranged in row and column on the top surface of the first substrate in terms of a plane.

20. The pressure sensitive display device of claim 16, further comprising a third electrode provided on the second substrate, wherein the third electrode has a resistivity greater than that of the second electrode.

21. The pressure sensitive display device of claim 16, further comprising a second substrate disposed on the second electrode, wherein the second substrate comprises a flexible substrate, and the second substrate is deformed in conjunction with the second electrode when the external pressure is applied.

22. The pressure sensitive display device of claim 16, further comprising a electron injection layer provided on a first surface of the light emitting layer, which faces the second electrode, or a hole injection layer provided on a second surface of the light emitting layer, which faces the first electrode.

* * * * *